US007362611B2

(12) United States Patent  
Roohparvar

(10) Patent No.: US 7,362,611 B2  
(45) Date of Patent: Apr. 22, 2008

(54) NON-VOLATILE MEMORY COPY BACK

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 217 days.

(21) Appl. No.: 11/215,993

(22) Filed: Aug. 30, 2005

(65) Prior Publication Data

US 2007/0047306 A1    Mar. 1, 2007

(51) Int. Cl.  
*G11C 11/34* (2006.01)  
*G11C 16/06* (2006.01)

(52) U.S. Cl. .................. 365/185.09; 365/185.33; 365/200

(58) Field of Classification Search ........... 365/185.09, 365/185.01, 185.33, 200; 711/103; 714/763, 714/768  
See application file for complete search history.

(56) References Cited

U.S. PATENT DOCUMENTS

| | | | |
|---|---|---|---|
| 6,041,374 A | 3/2000 | Postman et al. | |
| 6,078,520 A | 6/2000 | Tobita et al. | |
| 6,275,436 B1 | 8/2001 | Tobita et al. | |
| 6,314,474 B1 | 11/2001 | Walter et al. | |
| 6,421,279 B1 | 7/2002 | Tobita et al. | |
| 6,504,768 B1 | 1/2003 | Roohparvar et al. | |
| 6,529,416 B2 | 3/2003 | Bruce et al. | |
| 6,891,758 B2 | 5/2005 | Roohparvar | |
| 6,922,752 B2 | 7/2005 | Uysal et al. | |
| 6,968,400 B2 | 11/2005 | Lasserre | |
| 6,975,538 B2 | 12/2005 | Abedifard et al. | |
| 6,975,542 B2 | 12/2005 | Roohparvar | |
| 6,996,014 B2 | 2/2006 | Lee et al. | |
| 7,072,232 B2 * | 7/2006 | Shiota et al. | 365/191 |
| 2005/0120163 A1* | 6/2005 | Chou et al. | 711/103 |
| 2006/0050576 A1* | 3/2006 | Kim | 365/200 |
| 2006/0156189 A1* | 7/2006 | Tomlin | 714/763 |
| 2006/0282755 A1* | 12/2006 | Oh | 714/801 |

OTHER PUBLICATIONS

"Micron Technical Note—Small Block vs Large Block NAND Flash Devices", (2005), 14 pgs.

* cited by examiner

*Primary Examiner*—Anh Phung  
*Assistant Examiner*—Toan Le  
(74) *Attorney, Agent, or Firm*—Schwegman, Lundberg & Woessner, P.A.

(57) ABSTRACT

Data move operations in a memory device are described that enable identification of data errors. During a write operation, identified errors are flagged and used to provide an error status during the data move operation. Results of the error detection can be accessed by a memory controller for data repair operations by the controller.

22 Claims, 2 Drawing Sheets

NON-VOLATILE MEMORY COPY BACK

FIELD OF THE INVENTION

The present invention relates to memory devices and more particularly to non-volatile memory internal data move operations.

BACKGROUND

Error detection and correction (ECC) engines are well known to those skilled in the art. An ECC engine is a device which performs a process of detecting errors and correcting the errors to ensure the accuracy and integrity of data during a data transmission. Different ECC engines are based on Hamming Code, Reed-Solomon Code or other techniques to correct for data errors.

In memory systems a memory controller typically writes data and ECC data to a memory device. The ECC data is used by the controller during a read operation to identify and correct errors that may have occurred since the data was written to the memory.

Memory devices can be categorized in two broad areas as volatile and non-volatile. Volatile memory devices require power to maintain data, while non-volatile memories are capable of maintaining data in the absence of a power supply.

SUMMARY

In one embodiment, a non-volatile memory device comprises an array of memory cells, and control circuitry to perform a write operation to store data in the array. The write operation includes a verify operation to determine if the stored data contains an error. The control circuitry stores an error flag in a storage location of the memory to indicate that the stored data contains an error.

In another embodiment, a non-volatile memory device comprises an array of memory cells, control circuitry to perform a write operation to store data in the array, and an error register to store an error flag to indicate that the stored data contains an error.

A method embodiment comprises performing an internal data move operation in a memory device. The data move operation includes moving data from a first storage location to a second storage location. An error flag corresponding to the data is read and a status is provided to an external controller indicating an error status of the data.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

Embodiments of the present invention can include a semiconductor memory device having an array of memory cells. The memory cells are non-volatile, and can be charge trapping cells such as floating gate transistors or nitride read-only memory (NROM) cells, phase-change memory cells such as chalcogenide cells, programmable conductor random access memory (PCRAM), latching cells such as static RAM (SRAM), or magnetic random access memories (MRAM's). In addition, the memory cells can store one or more bits per cell.

Figure 1:
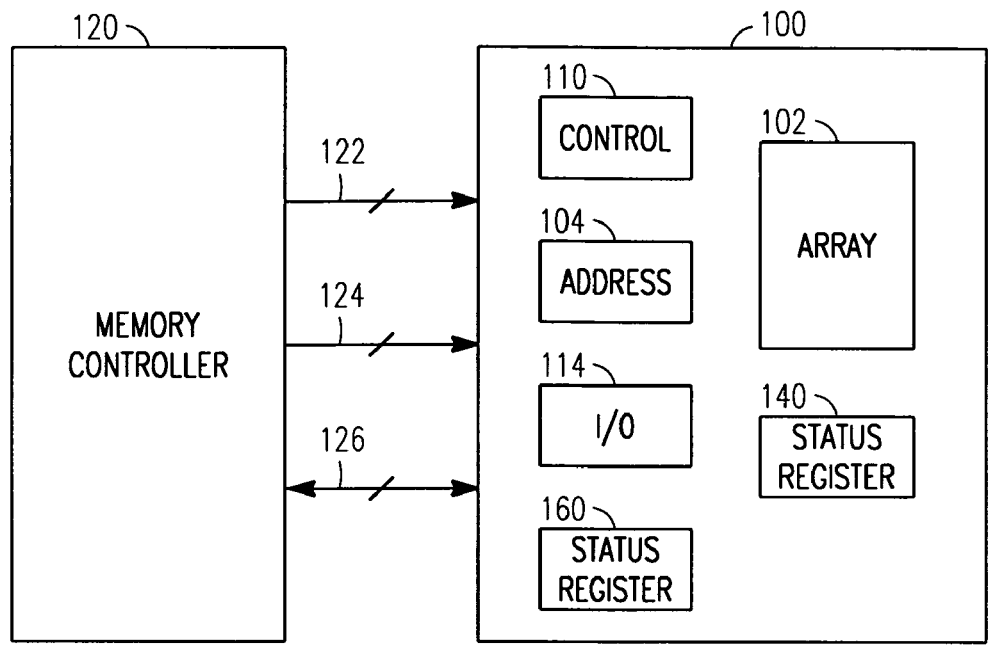
FIG. 1 is a block diagram of a memory system according to an embodiment of the invention.

FIG. 1 is a simplified block diagram of an integrated circuit dynamic memory device 100 in accordance with an embodiment of the invention. The memory device 100 includes an array of non-volatile memory cells 102, an address circuitry 104, and Input/Output (I/O) circuitry 114. In one embodiment the memory array is a NAND Flash memory array. In another embodiment, the memory array is a NOR Flash memory array.

A control circuit 110 is provided to manage memory operations, such as read, write and erase operations. As explained below, one memory operation performed by the memory control circuitry includes an internal data move operation.

The memory device 100 can be coupled to a controller 120 for accessing the memory array 102. The memory device 100 receives control signals across control lines 122 from the controller 120 to control access to the memory array 102. Access to the memory array 102 is directed to one or more target memory cells in response to address signals received across address lines 124. Once accessed in response to the control signals and the address signals, data is written to or read from the memory cells across data, DQ, lines 126.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features.

In addition to general memory functions, control circuitry 110 performs a write operation to store data in the array. As explained below, the write operation comprises a verify operation to determine if the stored data contains an error. The control circuitry stores an error flag in a storage location of the memory to indicate that the stored data contains an error. Further, the control circuitry performs an internal data move operation wherein stored data is moved from a first array location to a second array location.

Prior art non-volatile memory devices often perform a verify operation while writing data to the memory. The verify operation checks the data to determine if it is correctly written to a cell. If the data is not correct, additional program functions are performed until the memory cell passes the verify step. If a cell does not properly program within a predetermined maximum number of program functions, the cell is often labeled as bad. In some memory devices, such as multi-level cells (MLC) which store multiple bits in a single cell, subjecting a memory cell to numerous program functions can result in errors and data disturb conditions to neighboring cells. To address these concerns a "pseudo pass" function has been provided.

The pseudo pass function is used to stop programming operations when the memory data being written is close to correct. That is, recognizing that the external memory controller can detect and correct multi-bit errors allows the memory to stop programming operations when the data is close to correct.

Non-volatile memory devices, such as Flash memories, often perform an internal data move operation. This operation is performed as part of "house keeping." That is, data stored in a first memory array location is moved to a second memory array location so that memory operations, such as memory cell erasing, can be performed on the first location. In prior art memory devices, the data is not read by the controller during the move operation. As such, the ECC circuitry of the controller is not employed during the move to determine if an error exists in the memory data.

Embodiments of the invention register the location of data that corresponds to a pseudo pass operation during programming. That is, if the data is not correctly written to the memory, a flag is set. As such, the external memory controller can be notified if an internal move operation is requested for data that corresponds to a set flag. The memory controller can then read the data, perform an error correction on the data and re-write the data to the memory.

The flag is stored in the memory and can be located in the array 102 or other storage location. For example, the flag data can be stored in an over-head location of the array, with the programmed data, or in a separate register 140 on the memory.

Figure 2:
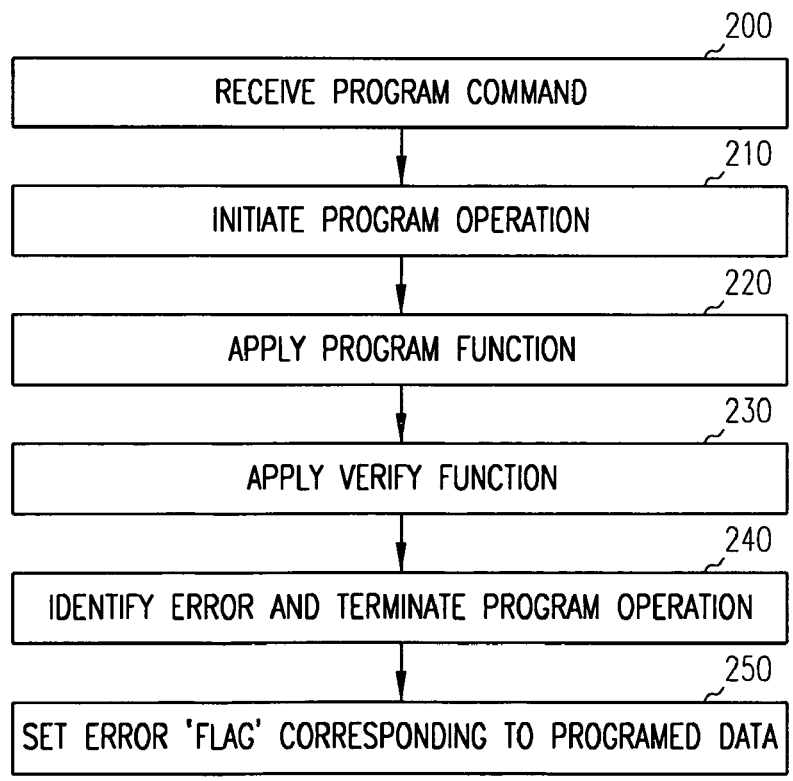
FIG. 2 is a flow chart illustrating embodiments of the present invention.

FIG. 2 is a flow chart illustrating embodiments of the present invention. In response to a program command 200 received by the memory controller, the memory initiates a program operation 210 to store originally provided data. During the program operation, at least one program 220 and verify 230 functions are performed. If the data is verified to contain errors but still be within a pre-determined accuracy of the original, the program operation is terminated 240 and an error flag is set 250. In one embodiment the error flag is stored in a memory cell(s) of the array.

Figure 3:
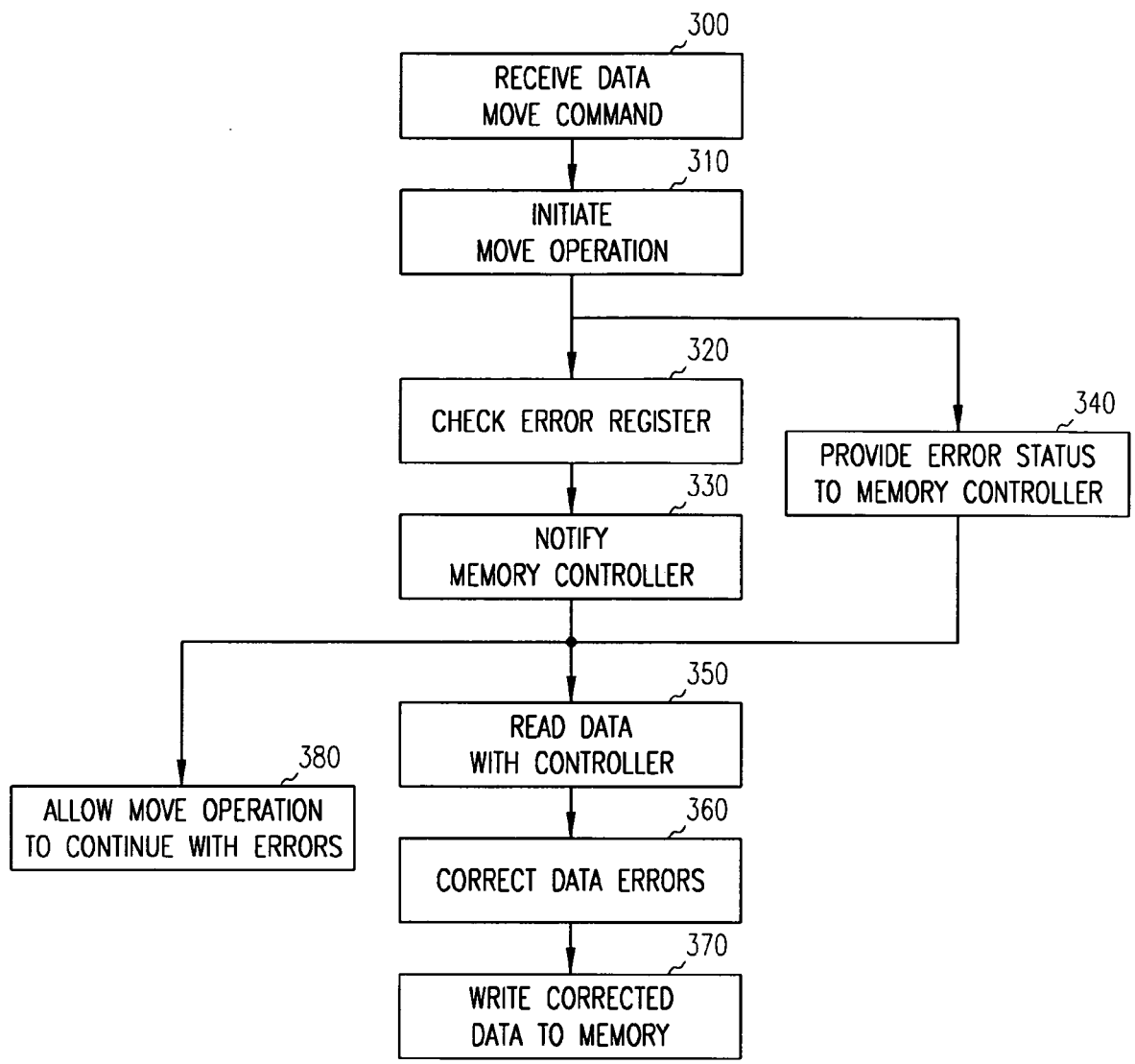
FIG. 3 is a flow chart illustrating additional embodiments of the present invention.

FIG. 3 is a flow chart illustrating embodiments of the present invention. In response to a data move command 300 received by the memory controller, the memory initiates a move operation 310 to move data from a first array location to a second array location. The memory checks the status of the error flag 320. If the error flag register is set to indicate the presence of an error in the data, a notification is provided to the memory controller 330. In one embodiment, the contents of error register 140 are provided in status register 160 (FIG. 1) readable by the controller 120. That is, the memory does not evaluate the error register but provides an error status to the memory controller 340.

In response to the notification, the memory controller reads the data 350 and performs an error correction operation 360 on the data. The memory controller then writes the corrected data back to the memory 370. In response to the notification 330 or error status 340, the memory controller can optionally allow the memory device to continue with the data move operation 380. In this embodiment the error(s) contained in the data will remain after the data move.

Data move operations in a memory device have been described that enable identification of data errors. During a write operation, identified errors are flagged and the flag is then used to provide an error status during a later performed data move operation. Results of the error detection can be accessed by a memory controller for data repair operations by the controller. The above embodiments can be particularly useful in MLC (multi-level cell) memory devices such as MLC NAND Flash devices.

The invention claimed is:

1. A non-volatile memory device comprising:
an array of memory cells; and
control circuitry to perform a programming operation including a write operation to store data in the array, the write operation comprises a verify operation to determine if the stored data contains an error, the control circuitry to perform a pseudo pass function, wherein the control circuitry stores a flag in a memory to indicate a location of data stored in the array of memory cells on which the pseudo pass function has performed during the programming operation.

2. The non-volatile memory device of claim 1, wherein the control circuitry performs an internal data move operation wherein stored data with pseudo pass function performed on it is moved from a first array location to a second array location.

3. The non-volatile memory device of claim 2, wherein the memory device provides a status to an external controller in response to the flag and the internal data move operation.

4. The non-volatile memory device of claim 1 wherein the array of memory cells comprises floating gate transistor memory cells.

5. A non-volatile memory device comprising:
an array of memory cells;
control circuitry to perform a programming operation including a write operation, a pseudo pass function and store data in the array; and
an error register to store an error flag to indicate that the stored data contains an error, wherein the control circuitry writes the error flag in the error register to indicate a location within the array of memory cells of error data on which the pseudo pass function has performed during the programming operation.

6. The non-volatile memory device of claim 5 wherein the memory cells store multiple bits of data per cell.

7. The non-volatile memory device of claim 5 wherein the write operation comprises a verify operation to determine if the stored data contains an error, and wherein the control circuitry programs the error register in response to the verify operation.

8. A system comprising:
a memory controller; and
a memory coupled to communicate with the memory controller, wherein the memory comprises,
an array of memory cells,
control circuitry to perform a programming operation including a write operation and a pseudo pass function and store data in the array, and
an error register to store an error flag to indicate that the stored data contains an error, wherein the control circuitry is configured to write the error flag in the error register to indicate the location of error data within the array of memory cells.

9. The system of claim 8 wherein the memory performs a data move operation in response to a command from the memory controller, wherein the data move operation comprises moving data from a first storage location to a second storage location.

10. The system of claim 9 wherein the memory provides a status to the memory controller indicating a status of the error register.

11. The system of claim 10 wherein the memory controller corrects an error present in the data.

12. A method comprising:
performing an internal data move operation in a memory device, wherein the data move operation comprises moving data from a first storage location to a second storage location;
performing a pseudo pass function on the data;
storing an error flag in an error register to indicate a location of data on which a pseudo pass function was performed;
reading the error flag corresponding to the data; and
providing a status to an external controller indicating an error stats of the data.

13. The method of claim 12 further comprising:
reading the data from the memory with the external controller;
correcting at least one error in the data; and
writing the corrected data to the memory device.

14. The method of claim 13 wherein the memory device stores multiple data bits per memory cell.

15. The method of claim 12, wherein performing a pseudo pass function includes performing a pseudo pass function using a control circuit.

16. A method of operating a non-volatile memory comprising:
writing data to a first storage location;
performing a verify operation including pseudo pass function, on the data and storing an error indicator corresponding to the data, wherein the error indicator identifies that the data contains an error;
performing an internal data move operation in a memory device, wherein the data move operation comprises moving the data from the first storage location to a second storage location;
evaluating the error indicator; and
programming a readable status register to indicate an error status of the data based upon the evaluation of the error indicator.

17. The method of claim 16 further comprises reading the register with an external memory controller.

18. The method of claim 16 further comprising:
reading the data from the second location with an external memory controller;
correcting at least one error in the data; and
writing the corrected data to the memory device.

19. A method comprising:
receiving a connnand from a memory controller to perform an internal data move operation in a memory device, wherein the data move operation comprises moving data from a first storage location to a second storage location;
receiving a command from the memory controller to perform a pseudo pass function on the data and storing an error flag to indicate a location within the memory device of error data on which the pseudo pass function has performed during a programming operation;
reading an error flag corresponding to the data to determine if an error is present in the data;
providing a status to the memory controller indicating a status of the error flag; and
correcting an error present in the data with the memory controller.

20. The method of claim 18 wherein providing the status to the memory controller comprises programming a status register and reading the status register with the memory controller.

21. A method of operating a multi-level cell flash memory device comprising:
initiating a write operation to store data at a first memory array location;
performing a verify operation of the data;
pseudo passing data using control circuitry;
storing an error indicator corresponding to the data, wherein the error indicator identifies that the data contains an error due to the write operation;
receiving a command to access the first memory location;
evaluating the error indicator in response to the command; and
providing an externally available status based upon the error indicator.

22. The method of claim 21 further comprising:
reading the data from the flash memory with an external memory controller;
correcting at least one error in the data; and
writing the corrected data to the flash memory device.

* * * * *

UNITED STATES PATENT AND TRADEMARK OFFICE
CERTIFICATE OF CORRECTION

PATENT NO. : 7,362,611 B2  
APPLICATION NO. : 11/215993  
DATED : April 22, 2008  
INVENTOR(S) : Roohparvar Page 1 of 1

It is certified that error appears in the above-identified patent and that said Letters Patent is hereby corrected as shown below:

In column 5, line 12, in Claim 12, delete "stats" and insert -- status --, therefor.

In column 6, line 3, in Claim 19, delete "connnand" and insert -- command --, therefor.

In column 6, line 19, in Claim 20, delete "claim 18" and insert -- claim 19 --, therefor.

Signed and Sealed this

First Day of July, 2008

JON W. DUDAS  
*Director of the United States Patent and Trademark Office*